US010840232B2

(12) United States Patent
Caffee et al.

(10) Patent No.: US 10,840,232 B2
(45) Date of Patent: Nov. 17, 2020

(54) SHIELDING IN A UNIT CAPACITOR ARRAY

(71) Applicant: Silicon Laboratories Inc., Austin, TX (US)

(72) Inventors: Aaron J. Caffee, Scappoose, OR (US); Brian G. Drost, Corvallis, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/019,746

(22) Filed: Jun. 27, 2018

(65) Prior Publication Data
US 2020/0006314 A1 Jan. 2, 2020

(51) Int. Cl.
| H01L 29/00 | (2006.01) |
| H01L 27/01 | (2006.01) |
| H01L 49/02 | (2006.01) |
| H01L 23/522 | (2006.01) |
| H03M 1/80 | (2006.01) |

(52) U.S. Cl.
CPC .......... *H01L 27/01* (2013.01); *H01L 23/5223* (2013.01); *H01L 28/60* (2013.01); *H03M 1/802* (2013.01)

(58) Field of Classification Search
CPC .................................................. H01L 23/5223
See application file for complete search history.

(56) References Cited

U.S. PATENT DOCUMENTS

| 7,199,650 B1 | 4/2007 | Welland et al. |
| 9,418,788 B2 | 8/2016 | Srinivas et al. |
| 2010/0117193 A1* | 5/2010 | Inoue ................... H01L 23/5223 257/532 |

* cited by examiner

*Primary Examiner* — Samuel A Gebremariam
(74) *Attorney, Agent, or Firm* — Zagorin Cave LLP

(57) ABSTRACT

An array of capacitors on an integrated circuit includes a plurality of unit capacitors. Each unit capacitor includes an isolated capacitor node formed in a pillar structure. Each unit capacitor further includes a shared capacitor adjacent to the isolated capacitor node. The shared capacitor node is electrically coupled to shared capacitor nodes of other unit capacitors in the array. Each unit capacitor further includes a shield node coupled to a low impedance node and formed adjacent to the isolated capacitor node to reduce the chance of capacitance forming between conductors to the isolated nodes and the shared nodes thereby preventing unwanted charge from entering the shared nodes and reducing linearity of the array.

23 Claims, 12 Drawing Sheets

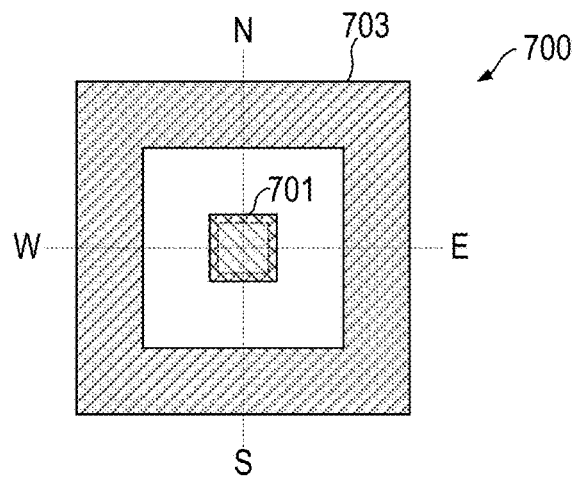
Fig. 7A
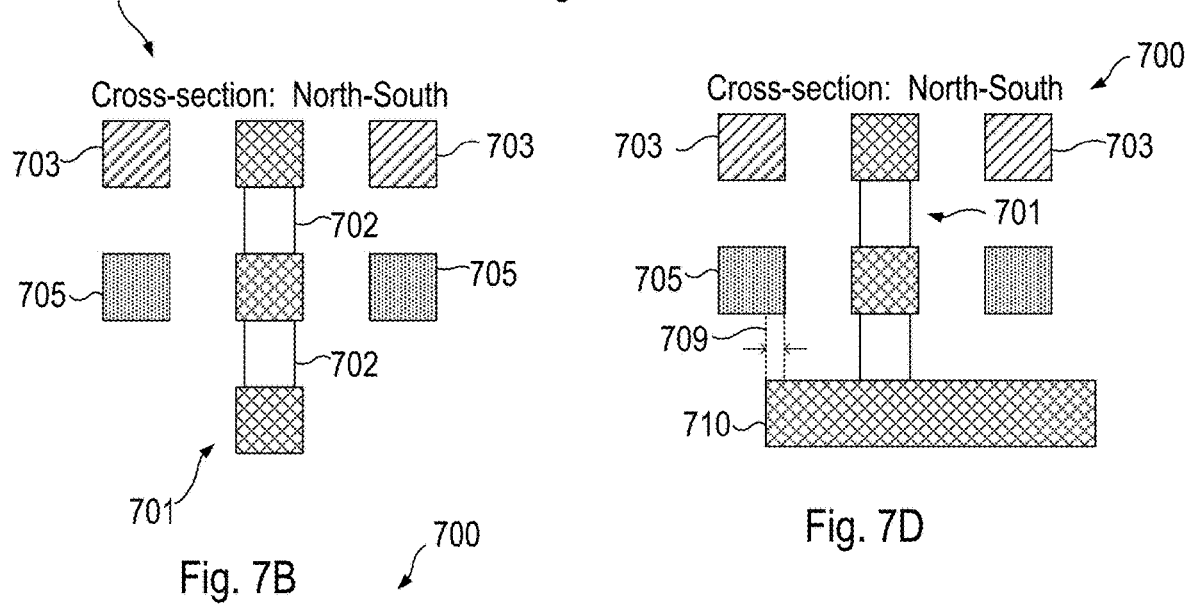
Fig. 7B
Fig. 7C
Fig. 7D
Fig. 7E

US 10,840,232 B2

SHIELDING IN A UNIT CAPACITOR ARRAY

BACKGROUND

Field of the Invention

The embodiments described herein relate to capacitors and more particularly to unit capacitors used in capacitor arrays in integrated circuits.

Description of the Related Art

Capacitor arrays are used in a variety of applications such as digital to analog converters (DACs). Capacitor DACs are commonly used for high performance data converters. Capacitor arrays have been formed in integrated circuits using unit capacitors and aggregating the unit capacitors where needed to form different capacitor weightings for the array. However, there has been reluctance for designers to move to geometries with ever smaller unit capacitor values (e.g., less than 1 femtoFarad (fF)) due to greater risk of differential and integral nonlinearity resulting from unit capacitor mismatch.

Accordingly, improved unit capacitors can lead to more accurate capacitor arrays for DACs and other applications using capacitor arrays.

SUMMARY OF EMBODIMENTS OF THE INVENTION

Accordingly, in one embodiment, an array of capacitors on an integrated circuit includes a plurality of unit capacitors, each unit capacitor includes an isolated capacitor node formed in a vertical structure on two or more metal layers of the integrated circuit and coupled by at least one via between each metal layer. Each unit capacitor further includes a shared capacitor node, the shared capacitor node formed adjacent to the isolated capacitor node, the shared capacitor node coupled through a low impedance path to shared capacitor nodes of others of the plurality of unit capacitors. Each unit capacitor further includes a shield node formed adjacent to the isolated capacitor node in at least one metal layer in which the isolated capacitor node is formed, the shield node coupled to a low impedance node.

In another embodiment, a method of making a capacitor array includes forming a plurality of unit capacitors, wherein forming each of the unit capacitors includes forming an isolated capacitor node in a vertical structure including two or more metal layers of an integrated circuit and one or more vias between each of the two or more metal layers. Forming each of the unit capacitors further includes forming a shared capacitor node adjacent to a first portion of the isolated capacitor node in an Nth metal layer, N being an integer of three or more, forming a shield node in at least one metal layer other than the Nth metal layer, and forming a shield conductor to couple the shield node to a low impedance node.

In another embodiment an array of capacitors includes a plurality of unit capacitors. Each unit capacitor includes an isolated capacitor node formed on multiple metal layers of an integrated circuit with at least one via between each of the multiple metal layers. Each unit capacitor further includes a shared capacitor node adjacent to the isolated capacitor node in at least one of a vertical or horizontal direction and each unit capacitor further includes a shield node formed by at least two fingers adjacent to the isolated capacitor node on at least one of the multiple metal layers and on a different metal layer than the shared capacitor node.

BRIEF DESCRIPTION OF THE DRAWINGS

The present invention may be better understood, and its numerous objects, features, and advantages made apparent to those skilled in the art by referencing the accompanying drawings.

FIG. 7A illustrates a top view of a unit capacitor according to an embodiment.

FIG. 7B illustrates a north-south cross section of the unit capacitor showing the shared node, the shield node, and the isolated node.

FIG. 7C illustrates a west-east cross section of the unit capacitor showing the shared node, the shield node, and the isolated node.

FIG. 7D illustrates a north-south cross section of the unit capacitor showing termination of a conductor to the isolated node under the shield node.

FIG. 7E illustrates a west-east cross section of the unit capacitor showing termination of a conductor to the isolated node under the shield node.

The use of the same reference symbols in different drawings indicates similar or identical items.

DETAILED DESCRIPTION

While manufacturing variations can be a source of nonlinearity in the capacitor array, systematic irregularities in layout can lead to significant nonlinearity especially for unit capacitors with low capacitance. As explained further herein, irregularities in layout and routing can negatively impact unit capacitor uniformity and thus addressing such irregularities can improve unit capacitor matching, and thus the linearity of the capacitor array and applications such as capacitor DACs. Such irregularities typically occur when the unit capacitors are connected together (or aggregated) to make up each of the DAC taps (e.g., for a binary encoded capacitor array bit 0 (b0) gets one unit capacitor, b1 gets two unit capacitors, b2 gets four unit capacitors, etc.). Mismatch in capacitor DAC unit capacitors with low capacitance unit capacitors can have a more pronounced affect than in higher capacitance unit capacitors. A lower capacitance unit capacitor design that maintains matching allows for higher performance circuits that use lower overall power. In addition, use of smaller unit capacitors lowers the design overall area (i.e., cost).

Figure 1A:
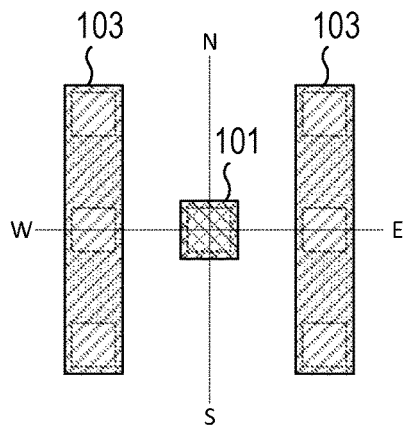
FIG. 1A illustrates a top view of a first prior art unit capacitor.

FIGS. 1A-4C illustrate various prior art approaches to unit capacitor design. FIG. 1A shows a top view of a unit capacitor having a first capacitor plate 101 formed in the center and a second capacitor plate formed as fingers 103. The first capacitor plate will be referred to as the isolated plate or node because that plate of the capacitor is isolated from other unit capacitors in the array (except for those with which it is connected to form a weighted capacitor). The second capacitor plate 103 will be referred to as the shared plate or node because the plate is electrically coupled by conductors to shared nodes of all the unit capacitors in the array (see FIG. 5E). The fingers 103 form the shared node of the unit capacitor. The north-south cross section shown in FIG. 1B shows the isolated node formed in three metal layers 105, 107, and 109 with vias 106 connecting the metal layers. The west-east cross section shows the isolated node 101 sandwiched between the fingers 103 of the shared node. The fingers 103 form a vertical wall. The wall is not continuous as the metal layers are coupled by vias between which is dielectric.

Figure 2A:
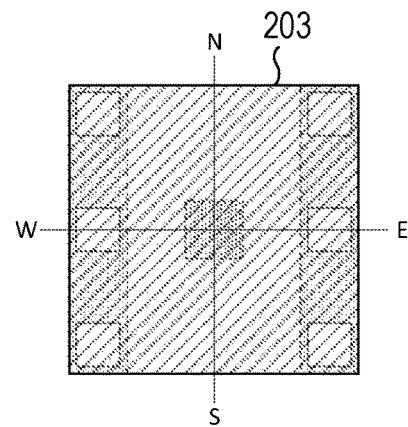
FIG. 2A shows a top view of a second prior art unit capacitor.
Figure 1B:
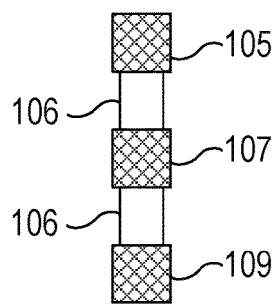
FIG. 1B illustrates a north-south cross section of the unit capacitor showing the isolated node.
Figure 2B:
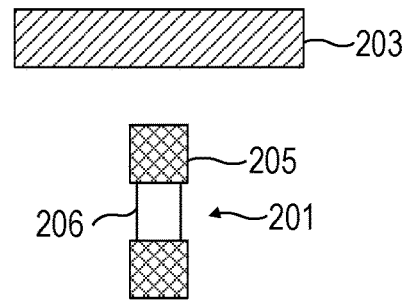
FIG. 2B illustrates a north-south cross section of the unit capacitor showing the shared node and the isolated node.
Figure 1C:
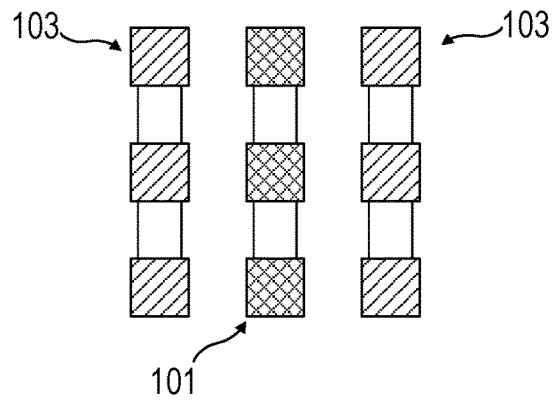
FIG. 1C illustrates a west-east cross section of the unit capacitor showing the isolated node and the shared node.
Figure 2C:
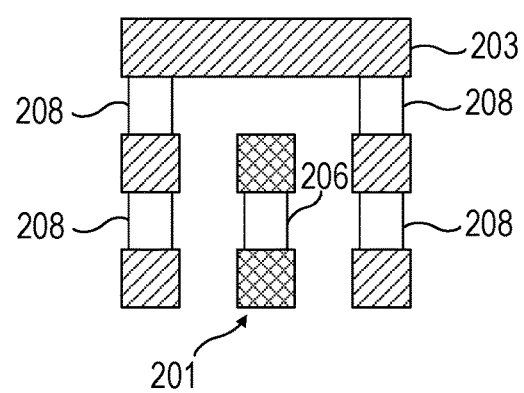
FIG. 2C illustrates a west-east cross section of the unit capacitor showing the isolated node and the shared node.

FIG. 2A show a second prior art approach having a wider metal area formed at the top of the unit capacitor to form the top of the shared node 203 in place of the fingers shown in FIG. 1A. FIG. 2B shows the north-south cross section of the unit capacitor. FIG. 2B shows the shared node 203 is formed one metal layer above the top metal layer 205 of the isolated node 201. FIG. 2C shows the vertical portions of the shared node coupled with vias 208 and the isolated node 201 on two metal layers with one via 206 connecting the two metal layers.

Figure 3A:
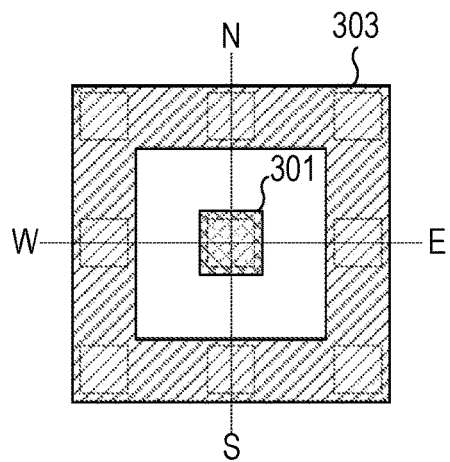
FIG. 3A illustrates a top view of a third prior art unit capacitor.
Figure 3B:
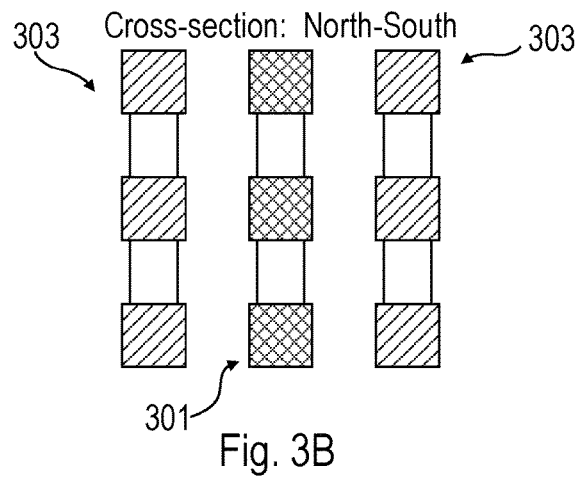
FIG. 3B illustrates a north-south cross section of the unit capacitor showing the isolated node and the shared node.
Figure 3C:
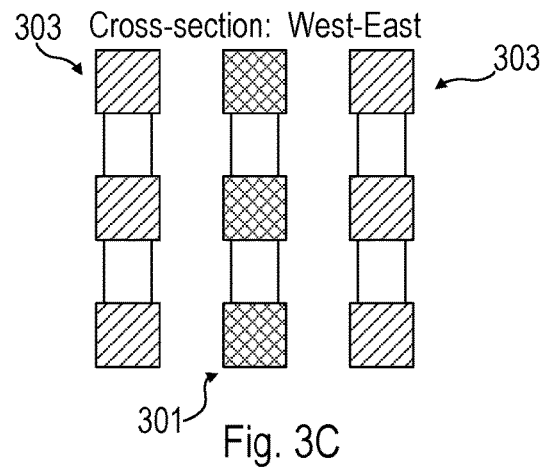
FIG. 3C illustrates a west-east cross section of the unit capacitor showing the isolated node and the shared node.

FIG. 3A illustrates another embodiment of a prior art unit capacitor array in which the top of the shared node 303 forms a ring around the isolated node. As can be seen in FIG. 3B and FIG. 3C, the ring of the shared node 303 encapsulates the isolated node 301.

Figure 4A:
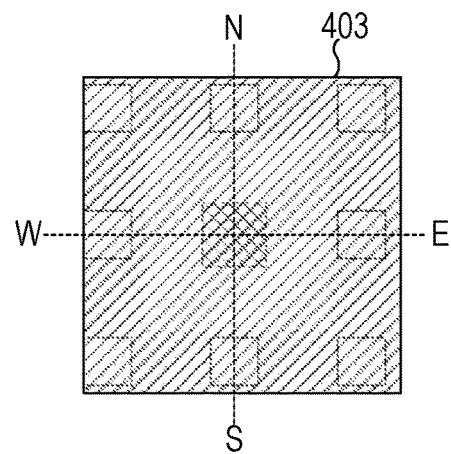
FIG. 4A illustrates a top view of a fourth prior art unit capacitor.
Figure 4B:
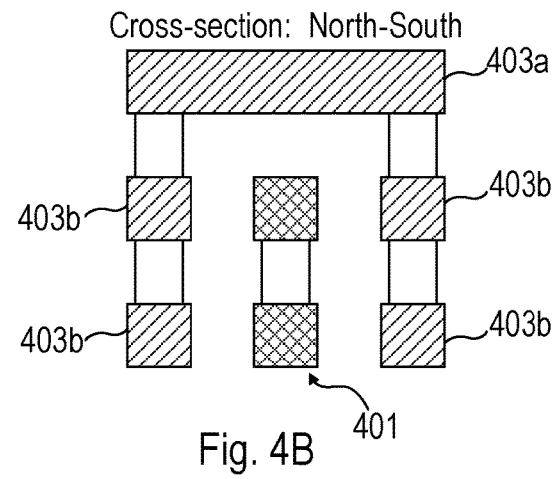
FIG. 4B illustrates a north-south cross section of the unit capacitor showing the isolated node and the shared node.
Figure 4C:
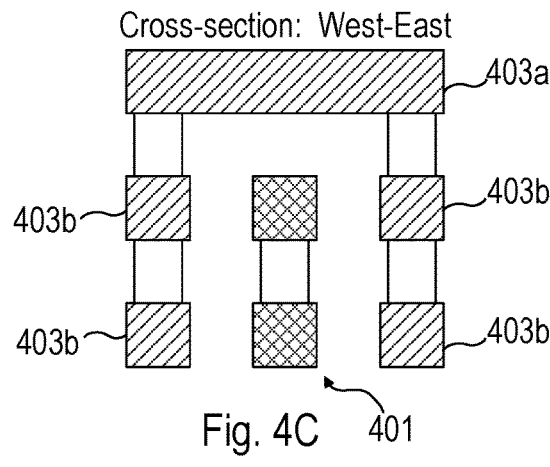
FIG. 4C illustrates a west-east cross section of the unit capacitor showing the isolated node and the shared node.

FIG. 4A illustrates another embodiment of a prior art unit capacitor array in which a wider metal area forms the top plate of the shared node 403 of the unit capacitor. As can be seen in FIG. 4B and FIG. 4C the lower portions 403b and the top plate 403a of the shared node 403 encapsulate the isolated node 401. The top plate 403a of the shared node is one metal level above the isolated node 401.

Routing to the isolated nodes can lead to parasitic capacitance forming between conductors to the isolated nodes and the shared node leading to unwanted charge being injected into the shared node as conductors to the isolated nodes switch. That unwanted charge leads to nonlinearity in the capacitor array. To address this issue, embodiments embed shielding into the unit capacitors so that wiring (also referred to herein as conductors) to each of the unit capacitors in the array does not cause parasitic capacitance being formed between the shared (output) node and the wiring to the isolated nodes of the unit capacitors. In capacitor DAC applications, that wiring is used for DAC taps into the weighted array. In addition, embodiments described herein with embedded shielding alleviate the routing limitations caused by encapsulation of the isolated node by the shared node.

Figure 5E:
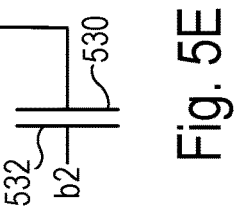
FIG. 5E illustrates schematically how a capacitor array has isolated and shared nodes.
Figure 5C:
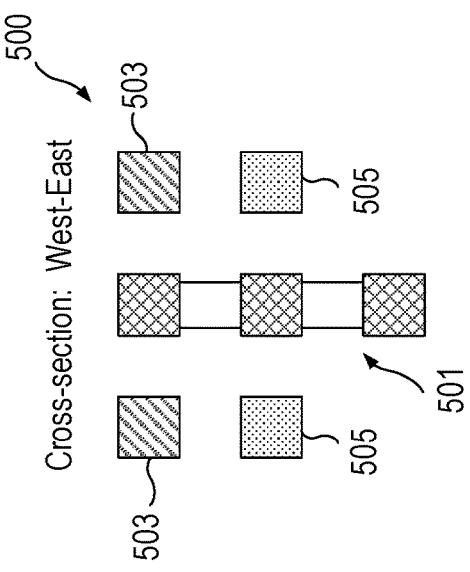
FIG. 5C illustrates a west-east cross section of the unit capacitor showing the shared node, the shield node, and the isolated node.
Figure 5D:
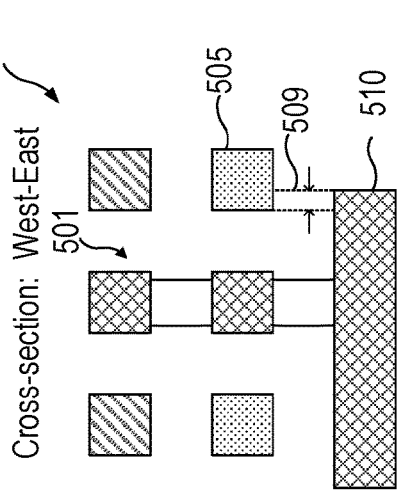
FIG. 5D illustrates a west-east cross section of a unit capacitor showing termination of a conductor to the isolated node under the shield node.
Figure 5A:
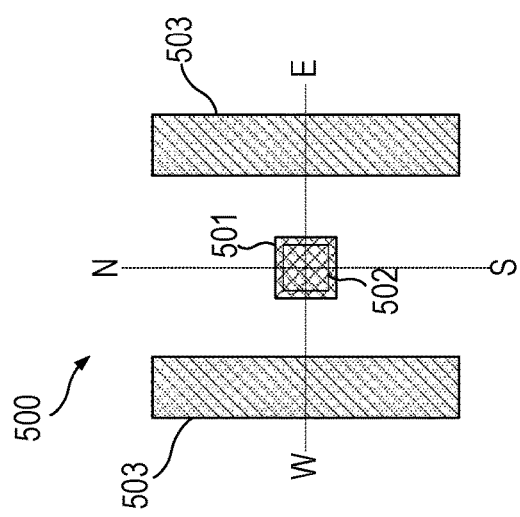
FIG. 5A illustrates a top view of a unit capacitor according to an embodiment.
Figure 5B:
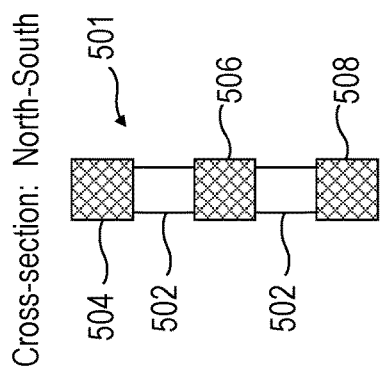
FIG. 5B illustrates a north-south cross section of the unit capacitor showing the isolated node.

Shown below are some exemplary unit capacitors that incorporate embedded shielding. Referring to FIGS. 5A-5D, an embodiment provides improved unit capacitors that are well suited for small capacitance values for the unit capacitor. FIG. 5A illustrates a top view of a unit capacitor 500 that includes an isolated node 501 and two fingers of a shared node 503. The shared node connects to other shared nodes of the capacitor array as shown in FIG. 5E. A shield node is disposed below the shared node. The top of a via 502 can be seen inside the top of the isolated node 501. FIG. 5B shows a north-south cross section of the isolated node 501 formed in three metal layers 504, 506, and 508, with vias 502 connecting the metal layers to form a pillar structure. Note that in the embodiments described herein, the number of metal layers shown is exemplary and additional metal layers may be utilized as dictated by such factors as the design needs of the capacitor array and the process technology utilized. FIG. 5C is a west-east cross section of the unit capacitor 500 showing the isolated node 501, the two fingers of the shared node 503, and the two fingers of the shield node 505. The shield node helps contain electric field lines in a controlled manner as explained further herein. In the example shown in FIGS. 5A-5D, the isolated pillar structure is formed on the first metal layer (M1) and routing of wiring to drive the isolated nodes all occurs on M1. FIG. 5D shows a wire 510 routed to the base of the pillar structure of the isolated node 501. It is advantageous to terminate that wire underneath the shield node 505 so there is overlap 509 between the termination of the wire in M1 and the shield node in M2 to help contain electric field lines that could otherwise couple between the wiring on M1 and the shared node 503.

FIG. 5E illustrates schematically how the shared nodes 503 of all the unit capacitors, shown as capacitor plates 530, couple through low impedance paths to a common node 531, while separate control lines b1, b2, b3 drive the isolated nodes 532 of the unit capacitors to selectively charge the unit capacitors. In a capacitor DAC, the capacitors will charge based on the digital code to be converted to an analog value. The shield nodes help prevent electric field lines from coupling into the shared node from the routing to the isolated nodes and causing undesired charge to enter the shared node. The unit capacitor embodiment also provides greater flexibility in routing the wires to the isolated nodes and reduces irregularities that could otherwise be present, thus improving linearity in the capacitor array.

Figure 6A:
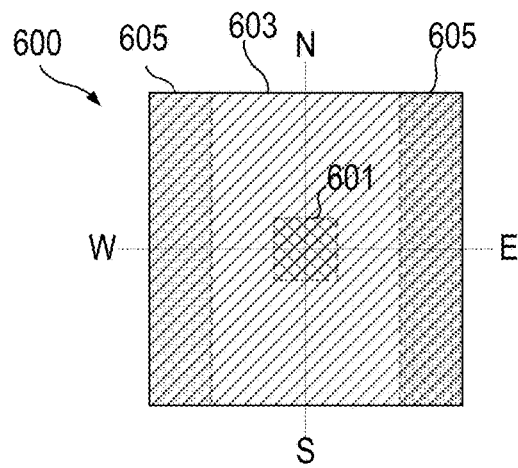
FIG. 6A illustrates a top view of a unit capacitor according to an embodiment.
Figure 6B:
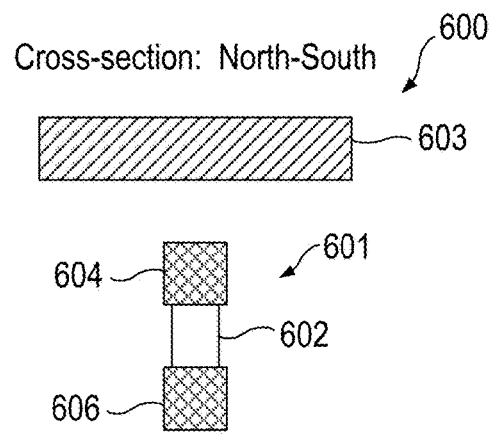
FIG. 6B illustrates a north-south cross section of the unit capacitor showing the shared node and the isolated node.
Figure 6C:
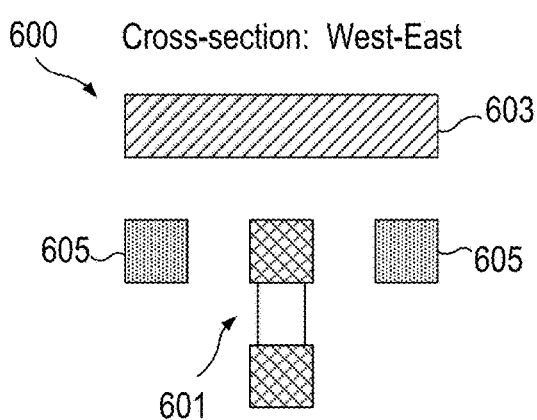
FIG. 6C illustrates a west-east cross section of the unit capacitor showing the shared node, the shield node, and the isolated node.

FIG. 6A shows another embodiment that provides improved unit capacitors that are well suited for small unit capacitance values. FIG. 6A illustrates a top view of a unit capacitor 600 that includes an isolated node 601 and a wider metal area formed at the top of the unit capacitor to form the shared node 603. Two fingers forming the shield node 605 can be seen below the shared node 603. FIG. 6B is a north-south cross section of the unit capacitor 600 showing isolated node 601 formed in two metal layers 604 and 606 with via 602 connecting the metal layers to form a pillar structure. The shared node is vertically adjacent to the isolated node and the capacitance formed is primarily vertical as compared to the lateral capacitance formed in the embodiment of FIG. 5A. Note that additional metal layers may be utilized for the isolated node as dictated by such factors as the design needs of the capacitor array and the process technology utilized. FIG. 6C shows a west-east cross section of the unit capacitor 600 containing the isolated node 601, the shared node 603, and the two fingers of the shield node 605. The shield node helps contain electric field lines in a controlled manner. In the example shown in FIGS. 6A-6D, the base of the isolated pillar structure is formed on metal M1 and M1 also contains the wiring to drive the isolated nodes.

Figure 6D:
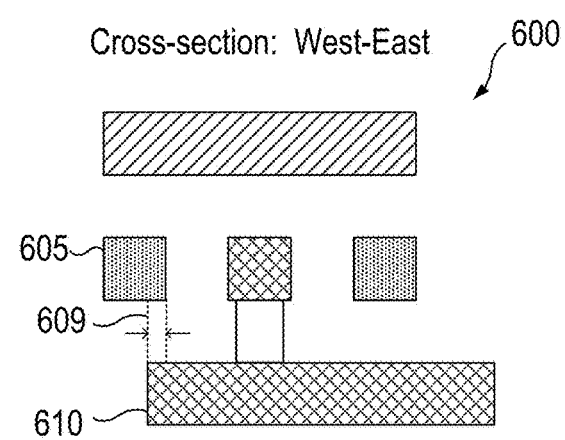
FIG. 6D illustrates a west-east cross section of the unit capacitor showing termination of a conductor to the isolated node under the shield node.

FIG. 6D shows a routing of wire 610 to the base of the isolated node 601. It is advantageous to terminate the wire 610 underneath the shield node 605 rather than at the base of the shared node so there is overlap 609 between the termination of the wire in M1 and the shield node 605 in M2 to help contain electric field lines emanating from the wire termination. Note that the routing can come in from the east or the west and terminate under either finger of the shield node.

FIG. 7A shows another embodiment that provides an improved unit capacitor that is well suited for small unit capacitance values. FIG. 7A illustrates a top view of a unit capacitor 700 that includes an isolated node 701 and a shared node 703 forming a ring around the isolated node 701. FIG. 7B shows a north-south cross section of the unit capacitor 700, which cross section includes isolated node 701 formed in three metal layers with vias 702 connecting the metal layers to form a pillar structure. The cross section of FIG. 7B also shows the north and south sides of the ring structure with shared node 703 and shield node 705 surrounding isolated node 701. FIG. 7C shows the east and west sides of the ring structures of the shared node 703 and the shield node 705 surrounding the isolated node 701. In the example shown in FIGS. 7A-7E, the isolated pillar structure is formed on M1 and M1 also contains the wiring to drive the isolated nodes.

FIG. 7D shows a north-south cross section of unit capacitor 700 that shows routing of wire 710 to the base of isolated node 701. The wire 710 enters the unit capacitor 700 from the right. It is advantageous to terminate the wire 710 underneath the shield node 705, rather than at the base of the isolated node 701, so there is overlap 709 between the wire in M1 and the shield node 705 in M2 to help contain electric field lines. Note that the wire can come in from the north or the south and terminate under any of the other three sides of the shield node ring structure.

FIG. 7E shows a west-east cross section of unit capacitor 700 that shows routing of wire 712 to the base of the isolated node 701. The wire 712 enters the unit capacitor from the left. It is advantageous to terminate wire 712 underneath the shield node 705 rather than at the base of the shared node, so there is overlap 709 between the termination of wire 712 in M1 and the shield node 705 in M2 to help contain electric field lines. Note that the wire 712 can come in from the east or the west and terminate under any of the other three sides of the shield node ring structure.

Figure 8A:
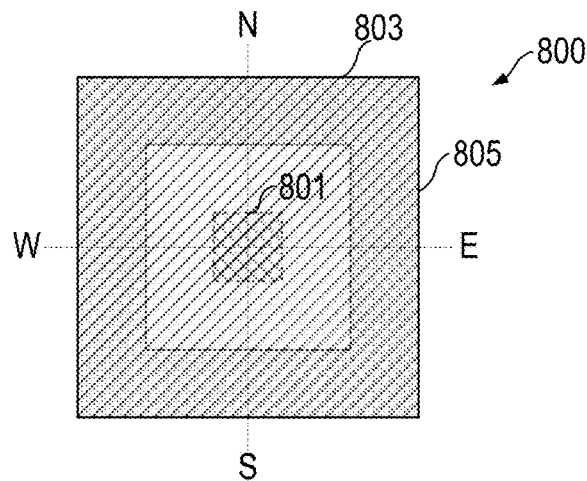
FIG. 8A illustrates a top view of a unit capacitor according to an embodiment.
Figure 8B:
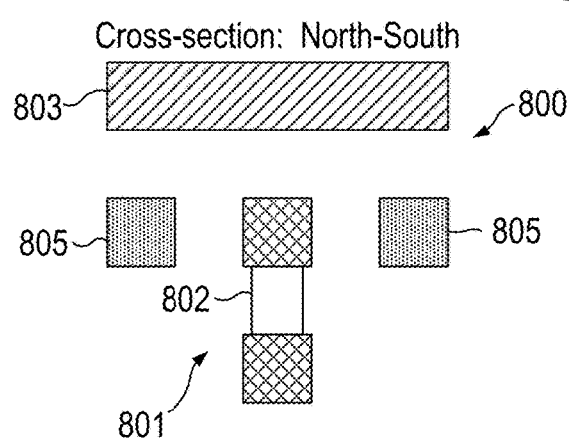
FIG. 8B illustrates a north-south cross section of the unit capacitor showing the shared node, the shield node, and the isolated node.

FIG. 8A shows another embodiment that provides an improved unit capacitor that is well suited for small unit capacitance values. FIG. 8A illustrates a top view of a unit capacitor 800 that includes an isolated node 801 and a shared node 803 forming a plate above the isolated node 801. The ring structure of the shield node 805 is visible below the shared node 803. FIG. 8B shows a north-south cross section of the unit capacitor 800 that includes isolated node 801 formed in two metal layers with via 802 connecting the metal layers to form a pillar structure. The cross section of FIG. 8B also shows the plate of the shared node 803 one metal layer above the top of the pillar structure of the isolated node and the ring structure of shield node 805 surrounding isolated node 801. The cross section of FIG. 8C shows the plate of the shared node 803 one metal layer above the top of the pillar structure of the isolated node 801 and the ring structure of shield node 805 surrounding isolated node 801. In the example shown in FIGS. 8A-8E, the base of the isolated pillar structure is formed on M1 and the necessary conductors to drive the isolated node and to connect the isolated node to other unit capacitors in the array, if required to aggregate unit capacitors, are all formed on M1.

Figure 8D:
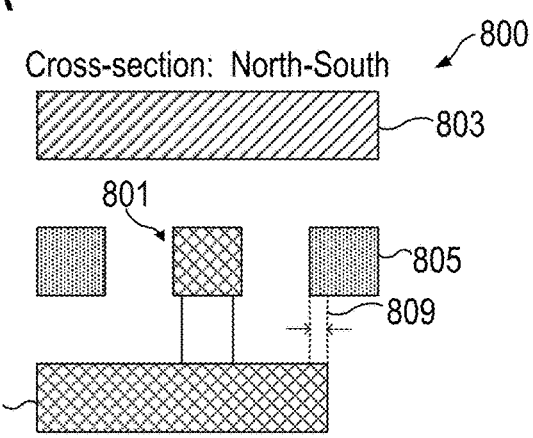
FIG. 8D illustrates a north-south cross section of the unit capacitor showing termination of a conductor to the isolated node under the shield node.
Figure 8C:
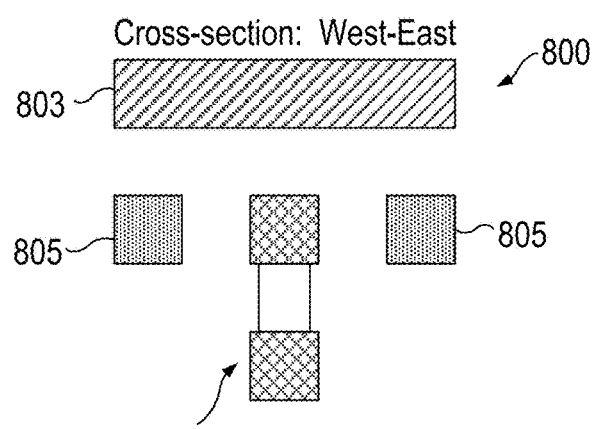
FIG. 8C illustrates a west-east cross section of the unit capacitor showing the shared node, the shield node, and the isolated node.

FIG. 8D shows a north-south cross section of unit capacitor 800 that illustrates routing of conductor 810 to the base of the isolated node 801. The wire 810 enters the unit capacitor 800 from the left. It is advantageous to terminate the wire 810 underneath the shield node 805, rather than at the base of the isolated node 801 so there is overlap 809 between the routing in M1 and the shield node 805 in M2 to help contain electric field lines. Note that the routing can come from the north or the south and terminate under any of the other three sides of the shield node ring structure.

Figure 8E:
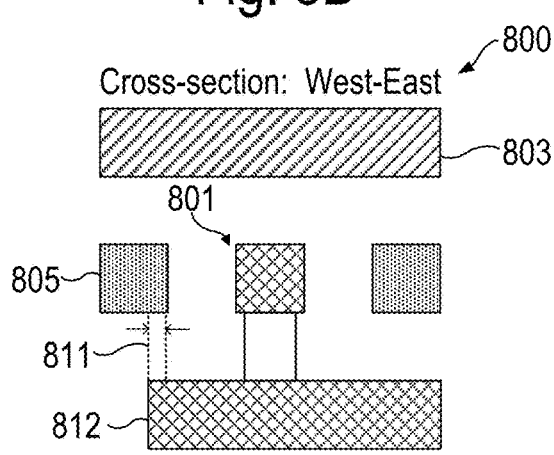
FIG. 8E illustrates a west-east cross section of a unit capacitor showing termination of a conductor to the isolated node under the shield node.

FIG. 8E shows the west-east cross section of unit capacitor 800 that illustrates routing of conductor 812 to the base of the pillar structure of the isolated node 801. The wire 812 enters the unit capacitor 800 from the right. It is advantageous to terminate that conductor underneath the shield node 805 so there is overlap 811 between the routing in M1 and the shield node 805 in M2 to help contain electric field lines. Note that the routing can come in from the east or the west and terminate under any of the other three sides of the shield node ring structure.

Figure 9:
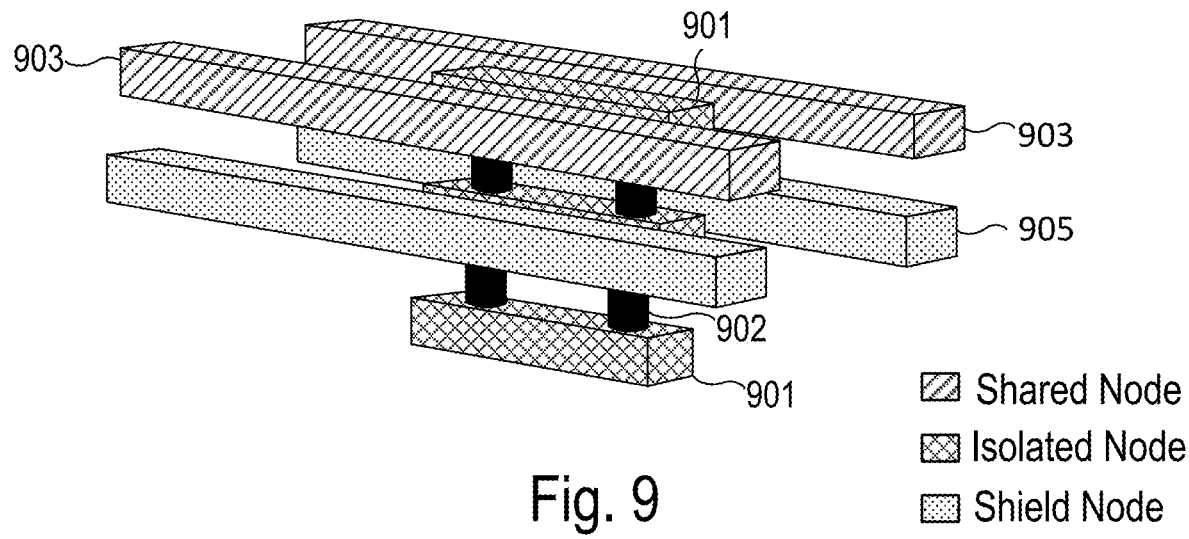
FIG. 9 illustrates a perspective view of an embodiment of a unit capacitor.

FIG. 9 shows a perspective view of the unit capacitor similar to that illustrated in FIGS. 5A to 5D. FIG. 9 shows the isolated node 901 as a finger structure that has a shorter length than the shared node 903 and the shield node 905. In other embodiments, such as shown in FIG. 5A to 5D, the length and shape of the isolated node may differ. As shown in FIG. 9 the shared node 903 is formed by two fingers on either side of the top of the isolated node. The shield node 905 is formed on either side of the isolated node and below the shared node. FIG. 9 shows the vias 902 coupling the different metal layers of the isolated node as black. While two vias are shown connecting each layer of the isolated node, other embodiments may have more or fewer vias. The example of FIG. 9 shows three metal layers being utilized for the isolated node but other embodiments may form the pillar structure of the isolated node in other numbers of metal layers, e.g., four, five or six. The shared node and the shield node may each be formed on one or more metal layers. In the embodiments of FIGS. 5A to 5D and 9, the lateral capacitance between the shared node and the isolated node dominates the capacitance of the unit capacitor.

Figure 10:
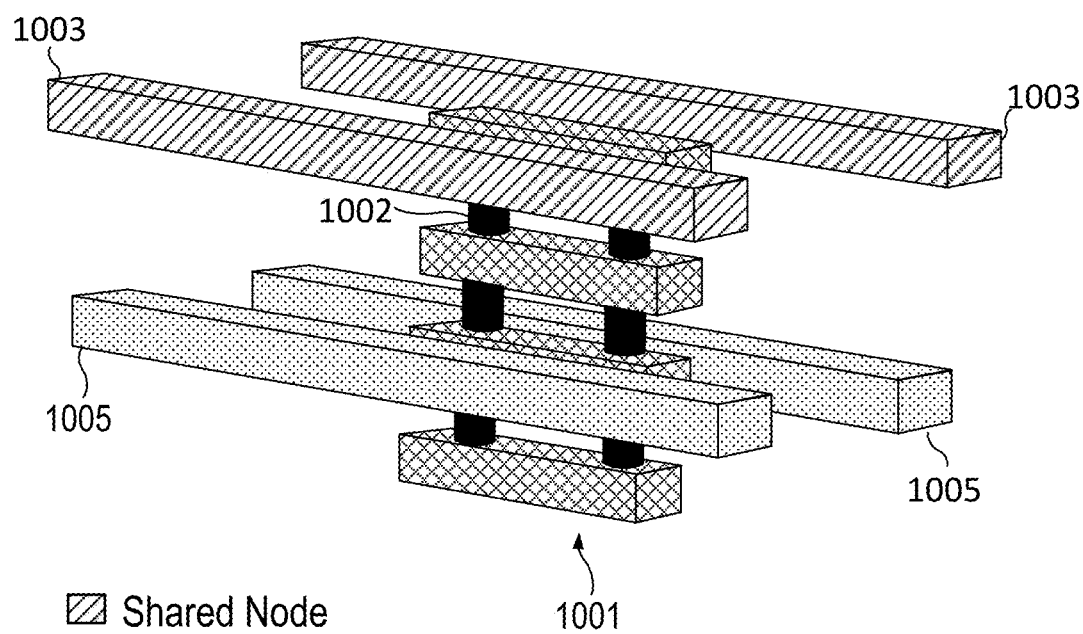
FIG. 10 illustrates a perspective view of another embodiment of a unit capacitor.

FIG. 10 shows a perspective view of a unit capacitor similar to that illustrated in FIG. 9 except the isolated node 1001 is formed in four metal layers (M1-M4) coupled by vias 1002. The shared node 1003 is formed in M4 and the shield node 1005 is formed in M2 and is closer to isolated node wiring on M1 than to M4 where the shared node is formed. Locating the shield nodes closer to the wiring for the isolated nodes helps reduce additional capacitance being formed between the isolated node wiring and the shared node.

The unit capacitors described herein provide reduced parasitic capacitance between the wiring to the isolated nodes and the shared nodes. That achieves better linearity. The unit capacitors described herein allows use of 0.1 fF unit capacitors and even as low as the 0.075 fF unit capacitors.

Figure 11:
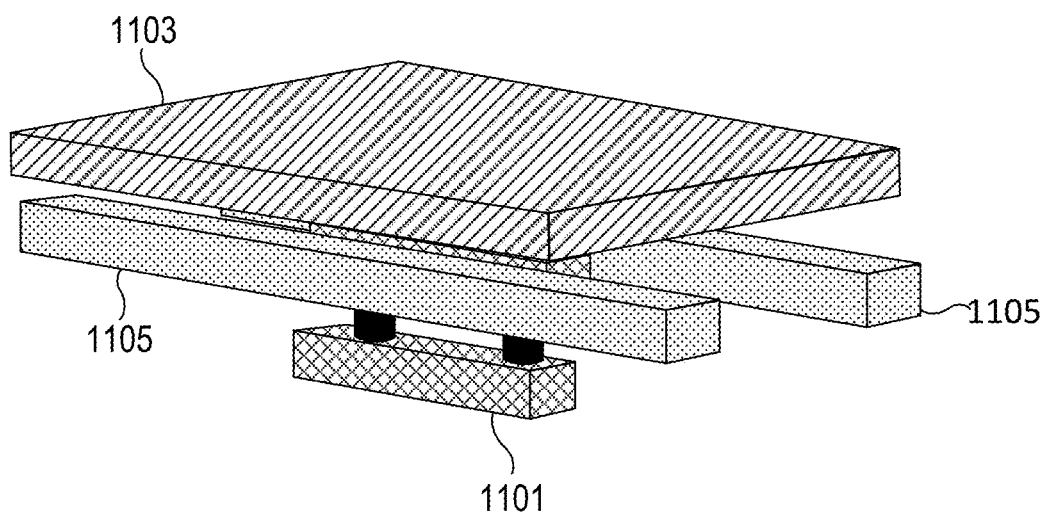
FIG. 11 illustrates a perspective view of another embodiment of a unit capacitor.

FIG. 11 shows a perspective view of the unit capacitor similar to that illustrated in FIGS. 6A to 6D. As shown in FIG. 11 the shared node 1103 is formed as a conductive plate formed above the top metal layer of the isolated node 1101. The shield node 1105 is formed on either side of the isolated node 1101 and below the shared node 1103. FIG. 11 shows the vias as black. The example of FIG. 11 shows two metal layers being utilized for the isolated node but other embodiments may form the pillar structure of the isolated node in other numbers of metal layers, e.g., three, four, five or six. In the embodiments of FIGS. 6A to 6D and 11, the vertical capacitance between the shared node and the isolated node dominates the unit capacitor.

Figure 12:
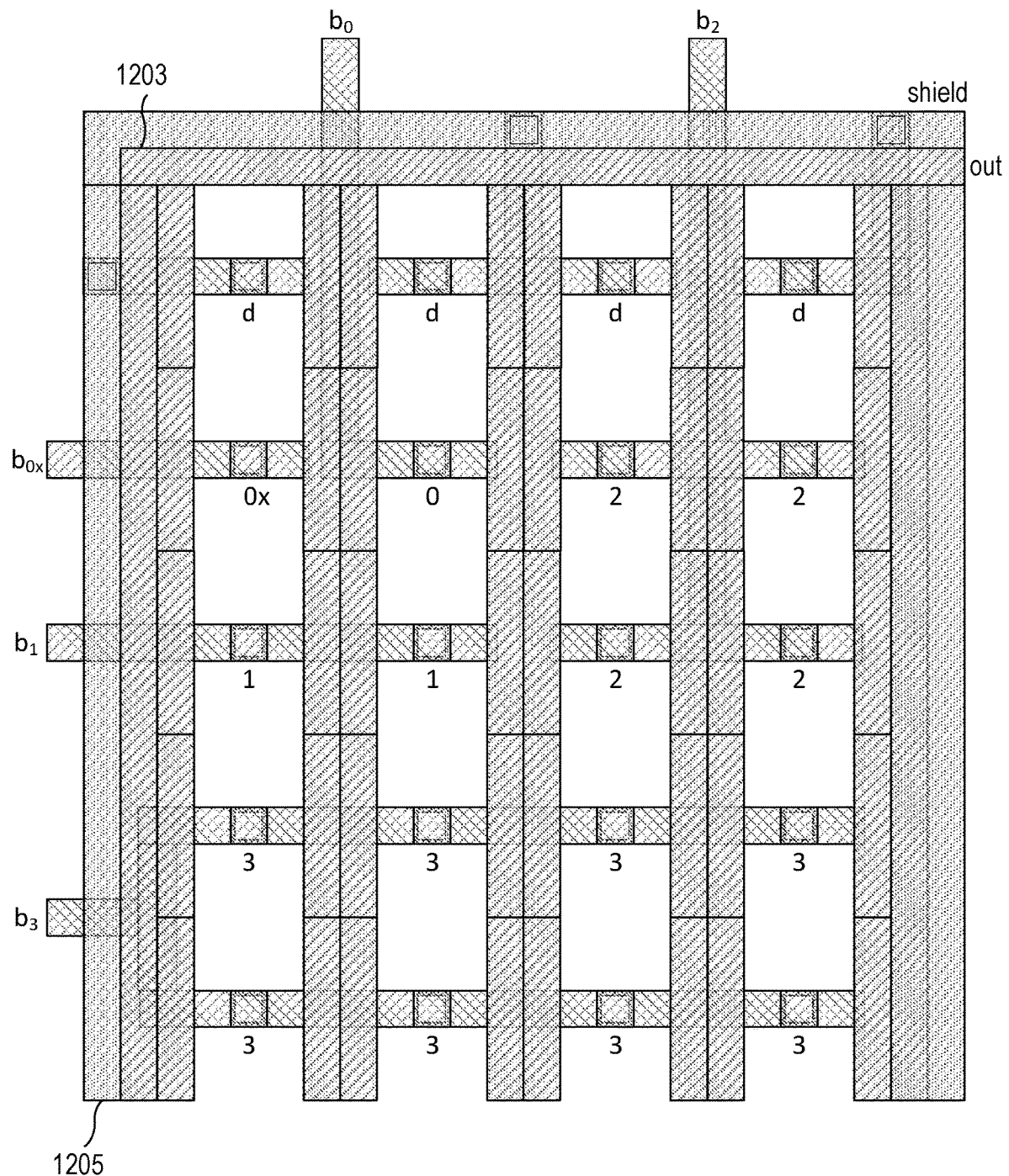
FIG. 12 illustrates a four-bit binary weighted capacitor array.

The unit capacitors with embedded shielding may be aggregated into the different sized capacitors to form, e.g., a binary encoded capacitor array that may be utilized in a DAC. Use of the embedded shielding helps ensure the wiring utilized for the DAC taps to drive the binary encoded capacitors in the array has minimal impact on data converter linearity. FIG. 12 illustrates a top view of the unit capacitor of FIG. 5A aggregated with binary weighting to form a four-bit binary weighted capacitor array that may be utilized in a DAC or other application.

The bits of the array are marked underneath the pillar structures of the isolated nodes. Thus, a single unit capacitor forms bit 0. Two unit capacitors form bit 1. Four unit capacitors form bit 2 and eight unit capacitors form bit 3. Dummy cells (marked with "d") are used on the top row to help provide uniformity in the unit capacitors. Dummies have only been included on one side in the example of FIG. 12 but other embodiments include dummies cells on both the top and bottom rows and on both sides. The DAC taps (b3, b2, b1, and b0) drive the isolated nodes. In the illustrated embodiment, the routing to the isolated nodes takes place in the lowest metal layer of the isolated pillar structure. For the illustrated example, assume the lowest metal layer is M1. In other embodiments, the lowest metal layer of the isolated pillar structure may be formed on a different met layer. FIG. 12 shows additional shield node 1205 and shared node 1203 above M1 on the outside of the array in addition to the nodes formed in the unit capacitors. A four by four array of units cells forms the four-bit DAC of FIG. 12 (ignoring the dummy cells). The four by four array includes an unused unit capacitor 0x. Note that the unused unit capacitor should be tied to a low impedance node.

Figure 13:
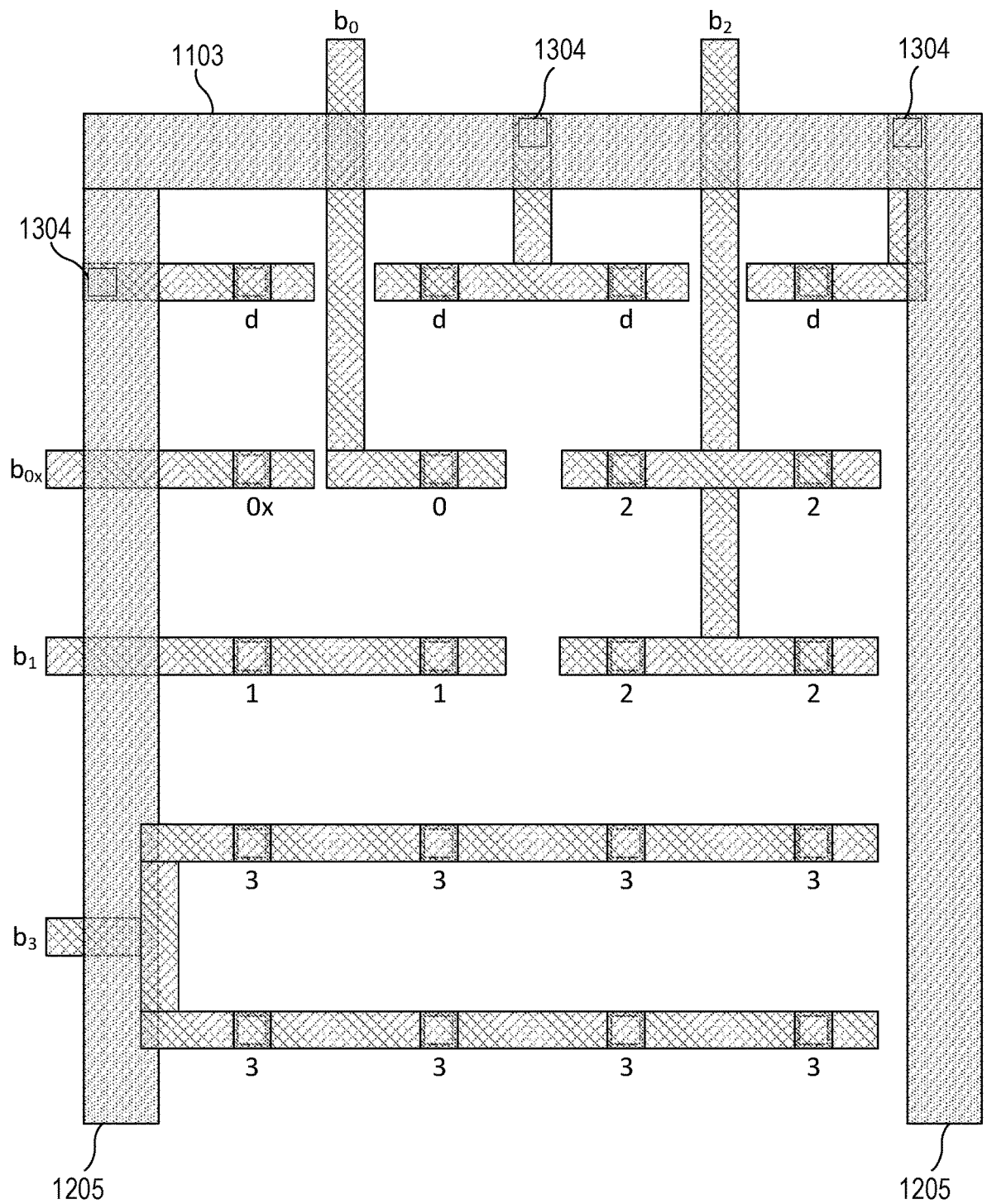
FIG. 13 illustrates a top view of the four-bit binary weighted capacitor array showing routing of conductors to the isolated nodes of the array.

FIG. 13 shows a top view of the four-bit array of FIG. 12 with some of the array structure removed to more easily see the wiring on M1 that connects to the various unit capacitors. The wiring is shown with the same cross hatch pattern as the isolated nodes. The shielding structure 1205 on the outside of the capacitor array and the isolated node pillar structures have been left in FIG. 13 to more easily understand the routing. Note that the dummy nodes are connected to the shield node using routing on M1 and the vias 1304 which go from M1 to the shield node on M2. Note that the wiring to the array comes from both the top and side in the example of FIG. 12. For example, the wiring for bit 3 forms a tuning fork structure to connect to eight unit capacitors and enters the array from the side while the wiring for bit 0 enters the array from the top.

Figure 14:
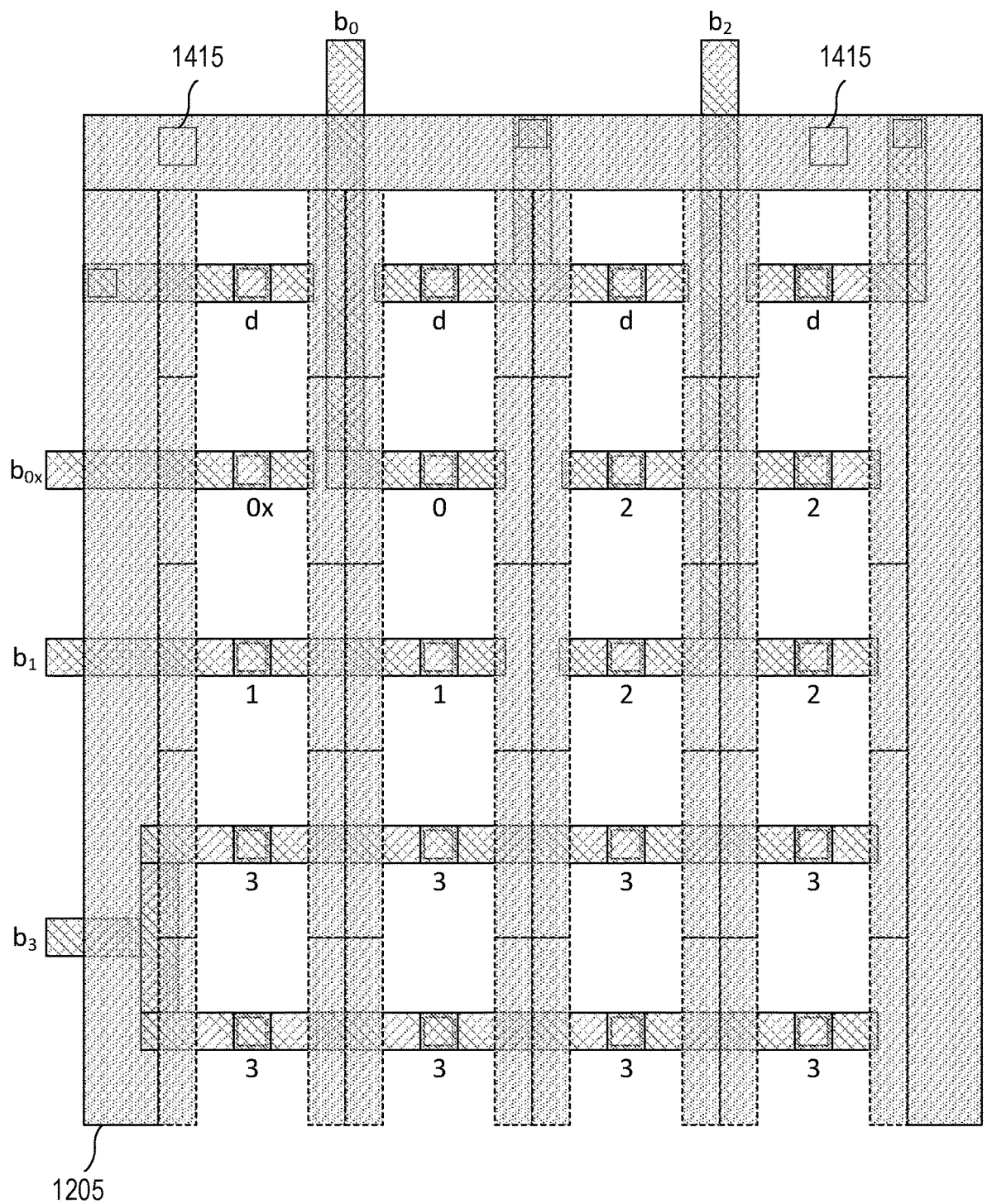
FIG. 14 illustrates a top view of the four-bit binary array showing the shield nodes on the second metal layer and routing on the first metal layer.

FIG. 14 shows another top view of the four bit array of FIG. 12 at the M2 level illustrating the shield node. FIG. 14 shows the shield node associated with each unit capacitor as well as additional shield node 1205 surrounding the capacitor array on three sides. The routing on M1 can be seen below the shield node. The shield node is coupled to a low impedance node such as a ground node or other low impedance node so that any charge from field lines from M1 wiring that coupled to the shield node can be safely handled by the low impedance node. The shield node may be coupled to a low impedance node, e.g., by coupling the shield node through vias 1415 (only two of which are shown for ease of illustration) to a ground plane. That helps ensure that unwanted charge is not injected into the shared node by stray capacitance.

Figure 15:
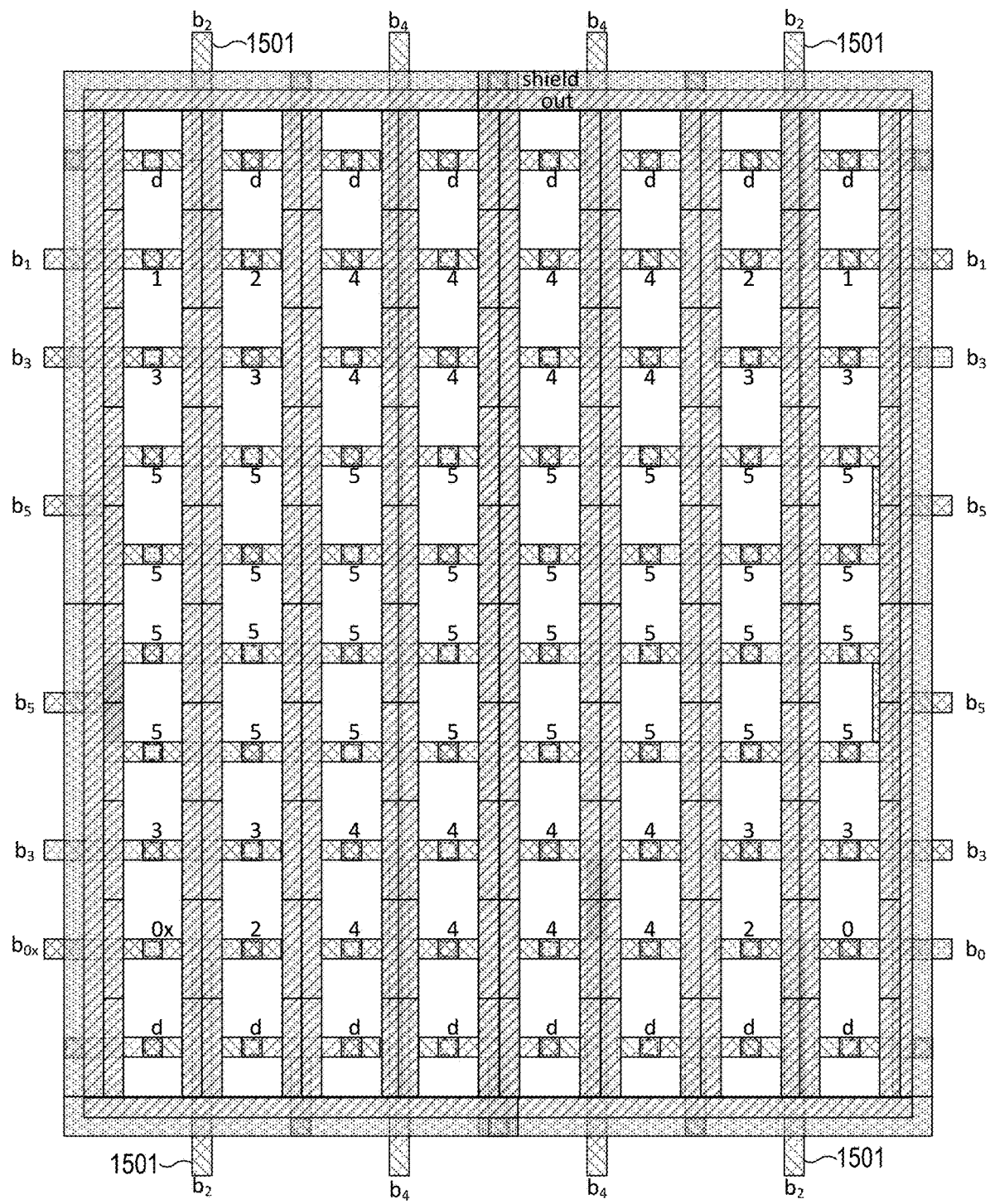
FIG. 15 illustrates a six-bit binary weighted array formed by four four-bit binary weighted arrays.

FIG. 15 shows how the four-bit binary weighted array structure of FIG. 12 can be utilized to form a 6-bit capacitor array. FIG. 15 shows the wiring to drive the array enters the array from all four sides. Note that some of the cells are not contiguous. For example, b2 can be seen to be formed of four unit capacitors, two at the top and two at the bottom driven by four different b2 conductors 1501 entering the array. In addition, dummy rows (marked as d) can be seen at the top and bottom of the array. Other embodiments may also include dummy rows to the left and right of the array. Dummy rows ensure that each unit capacitor appears to be the same. Referring back to FIG. 12, the absence of the dummy row at the bottom can result in the unit capacitors forming the bottom row of the bit 3 unit capacitors seeing different metal terminations resulting in those unit capacitors being different than the unit capacitors in the top row of bit 3. The routing to the arrays and the edges of the arrays can result in irregularities that have to be managed. That can result in undesired nonlinearity in the capacitor array.

The structure of the unit capacitors and the flexibility in routing to the isolated nodes allows common centroid placement for capacitor arrays. Common centroid placement allows linear process gradients in the x-y directions to be canceled. Referring still to FIG. 15, the 32 unit capacitors driven by bit b5 are formed symmetrically in the x and y direction around the center of the array. Thus, the common centroid placement of FIG. 15 helps ensure cancellation of linear process gradients in the x-y directions. Similarly, bits b4, b3, and b2 have common centroid placements. Bit 1 can be seen to be symmetrical around the y axis. Bit b0 utilizes only one unit capacitor preventing common centroid placement. Note that only one unit capacitor is extra (0x) of the 64 unit capacitors used to form the capacitor array.

Thus, various embodiments for unit capacitors have been described and their use in capacitor arrays. The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. An array of capacitors on an integrated circuit comprising:
   a plurality of unit capacitors, each of the unit capacitors including,
      an isolated capacitor node formed in a vertical structure on two or more metal layers of the integrated circuit and coupled by at least one via between each metal layer;
      a shared capacitor node, the shared capacitor node formed adjacent to the isolated capacitor node, the shared capacitor node coupled through a low impedance path to a common node to which other shared capacitor nodes of the plurality of unit capacitors are coupled;
      a shield node formed adjacent to the isolated capacitor node in at least one metal layer in which the isolated capacitor node is formed;
   wherein each isolated capacitor node of the plurality of unit capacitors is driven by a different one of a plurality of separate control lines; and
   wherein each shield node of the plurality of unit capacitors is coupled to a ground node.

2. The array of capacitors as recited in claim 1 wherein: the shared capacitor node is disposed in an Nth metal layer above an N−1 metal layer in which a top the isolated capacitor node is disposed, where N is an integer greater than or equal to 3.

3. The array of capacitors as recited in claim 1 wherein: the shared capacitor node includes two fingers in a same metal layer in which a top of the isolated capacitor node is disposed, the top of the isolated capacitor node being disposed between the two fingers of the shared capacitor node in the same metal layer.

4. The array of capacitors as recited in claim 1 wherein the shared capacitor node forms a ring around the isolated capacitor node in a same metal layer in which a top of the isolated capacitor node is disposed.

5. The array of capacitors as recited in claim 1 wherein the shield node forms a ring around the isolated capacitor node and is disposed in a different metal layer than the shared capacitor node.

6. The array of capacitors as recited in claim 1 wherein a conductor is electrically connected to a base of the isolated capacitor node and the conductor terminates underneath the shield node and wherein the conductor is one of the separate control lines.

7. The array of capacitors as recited in claim 1 wherein routing of conductors into the array to connect to respective isolated capacitor nodes is disposed in a single metal layer.

8. The array of capacitors as recited in claim 7 wherein respective ones of the conductors enter the array on each of four sides of the array in the single metal layer.

9. The array of capacitors as recited in claim 7 wherein the shield node is formed in a metal layer closer to the single metal layer than to an Nth metal layer in which the shared capacitor node is disposed, where N is an integer of at least 4.

10. The array of capacitors as recited in claim 1 wherein the array is a binary weighted capacitor array having common centroid placements for at least higher weighted capacitor values to thereby cancel linear process gradients in x and y directions for the higher weighted capacitor values.

11. The array of capacitors as recited in claim 1 further comprising a plurality of dummy unit capacitors formed on a periphery of the array, the dummy unit capacitors coupled to the ground node.

12. A method of making a capacitor array comprising:
   forming a plurality of unit capacitors, wherein forming each of the unit capacitors includes,
      forming an isolated capacitor node in a vertical structure including two or more metal layers of an integrated circuit and one or more vias between each of the two or more metal layers;
      forming a shared capacitor node adjacent to a first portion of the isolated capacitor node in an Nth metal layer, N being an integer of three or more;
      forming a low impedance path to couple the shared capacitor node to a common node to which other shared capacitor nodes of the plurality of unit capacitors are coupled;
      forming a shield node in at least one metal layer other than the Nth metal layer; and
      forming a shield conductor to couple the shield node to a ground node.

13. The method of making the capacitor array as recited in claim 12 further comprising:
   forming a top of the isolated capacitor node in an Nth−1 metal layer.

14. The method of making the capacitor array as recited in claim 12 further comprising forming the shared capacitor node as two fingers in a same metal layer in which a top of the isolated capacitor node is disposed, the top of the isolated capacitor node being disposed between the two fingers in the same metal layer.

15. The method of making the capacitor array as recited in claim 12 further comprising forming the shared capacitor node as a ring structure around the isolated capacitor node in a same metal layer in which a top of the isolated capacitor node is formed.

16. The method of making the capacitor array as recited in claim 12 further comprising forming the shield node in a ring around the isolated capacitor node in a different metal layer than the Nth metal layer.

17. The method of making the capacitor array as recited in claim 12 further comprising:
   using a single metal layer to route conductors into the capacitor array to couple to respective isolated capacitor nodes, the conductors being respective control signals; and
   terminating the conductors that connect to the respective isolated capacitor nodes underneath respective shield nodes.

18. The method of making the capacitor array as recited in claim 17 further comprising forming the conductors to enter the capacitor array on each of four sides of the capacitor array in the single metal layer.

19. The method of making the capacitor array as recited in claim 17 further comprising forming the shield node in a metal layer closer to the single metal layer than to the Nth metal layer in which the shared capacitor node is disposed, where N is an integer of four or more.

20. The method of making a capacitor array as recited in claim 12 further comprising aggregating unit capacitors in the capacitor array to form a binary weighted capacitor array having common centroid placements for higher weighted aggregated capacitor values to thereby cancel linear process gradients in x and y directions for the higher weighted aggregated capacitor values.

21. The method as recited in claim 12 further comprising:
   forming conductors to couple to respective isolated capacitor nodes of the plurality of unit capacitors as respective control signals; and
   terminating the conductors that connect to the respective isolated capacitor nodes underneath respective shield nodes.

22. An array of capacitors comprising:
   a plurality of unit capacitors, each unit capacitor including,
      an isolated capacitor node formed on multiple metal layers of an integrated circuit with at least one via between each of the multiple metal layers;
      a shared capacitor node adjacent to the isolated capacitor node in at least one of a vertical or horizontal direction;
      a shield node formed adjacent to the isolated capacitor node on at least one of the multiple metal layers and on a different metal layer than the shared capacitor node; and
      wherein the shield node is coupled to a ground node and is interposed between a control line connected to a base of the isolated capacitor node and the shared capacitor node.

23. The array of capacitors as recited in claim 22 wherein the control line terminates underneath the shield node.

* * * * *

UNITED STATES PATENT AND TRADEMARK OFFICE
CERTIFICATE OF CORRECTION

PATENT NO. : 10,840,232 B2
APPLICATION NO. : 16/019746
DATED : November 17, 2020
INVENTOR(S) : Aaron J. Caffee and Brian G. Drost Page 1 of 1

It is certified that error appears in the above-identified patent and that said Letters Patent is hereby corrected as shown below:

In the Claims

In Column 9, Line 55, Claim 2 please insert --of-- after "top".

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*